United States Patent

Sugiyama

(10) Patent No.: US 9,805,734 B2
(45) Date of Patent: Oct. 31, 2017

(54) SIGNAL PROCESSING DEVICE, SIGNAL PROCESSING METHOD AND SIGNAL PROCESSING PROGRAM FOR NOISE CANCELLATION

(75) Inventor: Akihiko Sugiyama, Tokyo (JP)

(73) Assignee: NEC CORPORATION, Tokyo (JP)

(*) Notice: Subject to any disclaimer, the term of this patent is extended or adjusted under 35 U.S.C. 154(b) by 0 days.

(21) Appl. No.: 13/877,593

(22) PCT Filed: Sep. 15, 2011

(86) PCT No.: PCT/JP2011/071747
§ 371 (c)(1),
(2), (4) Date: Apr. 3, 2013

(87) PCT Pub. No.: WO2012/046582
PCT Pub. Date: Apr. 12, 2012

(65) Prior Publication Data
US 2013/0191119 A1    Jul. 25, 2013

(30) Foreign Application Priority Data
Oct. 8, 2010 (JP) .................... 2010-228655

(51) Int. Cl.
*G10L 21/0208* (2013.01)
*H04B 3/23* (2006.01)
(Continued)

(52) U.S. Cl.
CPC ..... *G10L 21/0208* (2013.01); *H03H 21/0012* (2013.01); *H04B 3/23* (2013.01);
(Continued)

(58) Field of Classification Search
USPC ......... 379/406.01, 5, 8, 9; 704/226, E21.002
See application file for complete search history.

(56) References Cited

U.S. PATENT DOCUMENTS 4,649,505 A * 3/1987 Zinser, Jr. .......... G10K 11/1784
                                                    348/610
5,848,151 A * 12/1998 Boudy .................. H04M 9/082
                                                    379/406.08
(Continued)

FOREIGN PATENT DOCUMENTS

JP    2-244098 A    9/1990
JP    7-212278 A    8/1995
(Continued)

OTHER PUBLICATIONS

Mirchandani, et al, EEE Trans. Circuit & System II Analog & Digital Signal Processing Oct. 1992, "A New Adaptive Noise Cancellation Scheme in the Presence of Crosstalk".*
(Continued)

*Primary Examiner* — Paras D Shah
*Assistant Examiner* — Yi-Sheng Wang
(74) *Attorney, Agent, or Firm* — Sughrue Mion, PLLC

(57) ABSTRACT

From a mixed signal in which a first signal and a second signal are mixed, the second signal is removed at low processing cost and without delay. As a result, an estimated first signal which has low residue of the second signal and low distortion is obtained.

An estimated first signal is generated by subtracting a pseudo second signal which is estimated to be mixed in a first mixed signal in which a first signal and a second signal are mixed from the first mixed signal. The pseudo second signal is obtained by a first adaptive filter using a second mixed signal in which the first signal and the second signal are mixed in a different proportion from the first mixed signal. A coefficient update amount of the first adaptive filter is made smaller as compared with a case when the estimated first signal is smaller than the first mixed signal, in case the estimated first signal is larger than the first mixed signal.

11 Claims, 10 Drawing Sheets

(51) Int. Cl.
  *H04M 9/08* (2006.01)
  *H03H 21/00* (2006.01)
  *G10L 21/0224* (2013.01)
  *G10L 21/0216* (2013.01)

(52) U.S. Cl.
  CPC ......... *H04M 9/082* (2013.01); *G10L 21/0224* (2013.01); *G10L 2021/02082* (2013.01); *G10L 2021/02165* (2013.01); *H03H 21/0067* (2013.01); *H03H 2021/0072* (2013.01); *H03H 2021/0078* (2013.01); *H03H 2021/0094* (2013.01)

(56) References Cited

U.S. PATENT DOCUMENTS

| | | | | |
|---|---|---|---|---|
| 6,700,976 | B2* | 3/2004 | Zhang | G10L 21/0208 345/589 |
| 7,072,465 | B1* | 7/2006 | Benesty | H04B 3/234 370/286 |
| 2004/0114542 | A1* | 6/2004 | Stopler | H04B 3/23 370/286 |
| 2010/0217587 | A1* | 8/2010 | Sato | G10L 21/0208 704/226 |
| 2011/0058667 | A1* | 3/2011 | Takada | H04M 9/082 379/406.08 |
| 2012/0183133 | A1* | 7/2012 | Lindstrom | H04M 9/082 379/406.01 |

FOREIGN PATENT DOCUMENTS

| | | |
|---|---|---|
| JP | 8-110794 A | 4/1996 |
| JP | 10-215193 A | 8/1998 |
| JP | 2000-172299 A | 6/2000 |
| JP | 2001-22383 A | 1/2001 |
| JP | 2001-509659 A | 7/2001 |
| JP | 2008-42816 A | 2/2008 |
| JP | 2010-152021 A | 7/2010 |
| WO | 2005/024787 A1 | 3/2005 |

OTHER PUBLICATIONS

Mader et al Signal Processing 80 (2000) pp. 1697-1719 "Step-size control for acoustic echo cancellation filters—an overview".*

Mirchandani, et al, EEE Trans. Circuit & System II Analog & Digital Signal Processing Oct. 1992, A New Adaptive Noise Cancellation Scheme in the Presence of Crosstalk.*

Ikeda et al, IEEE Trans. Signal Process, Mar. 1999 "An Adaptive Noise Canceller with Low Signal Distortion for Speech Codecs".* iKeda et al, IEICE Trans. Fundamental Aug. 1999 "An adaptive Noise Canceller with Low Signal-Distortion in the Presence of Crosstalk".*

Communication dated Feb. 2, 2016 from the Japanese Patent Office issued in corresponding Japanese Application No. 2012-537638.

Communication dated Sep. 29, 2015, issued by the Japan Patent Office in corresponding Japanese Application No. 2012-537638.

* cited by examiner

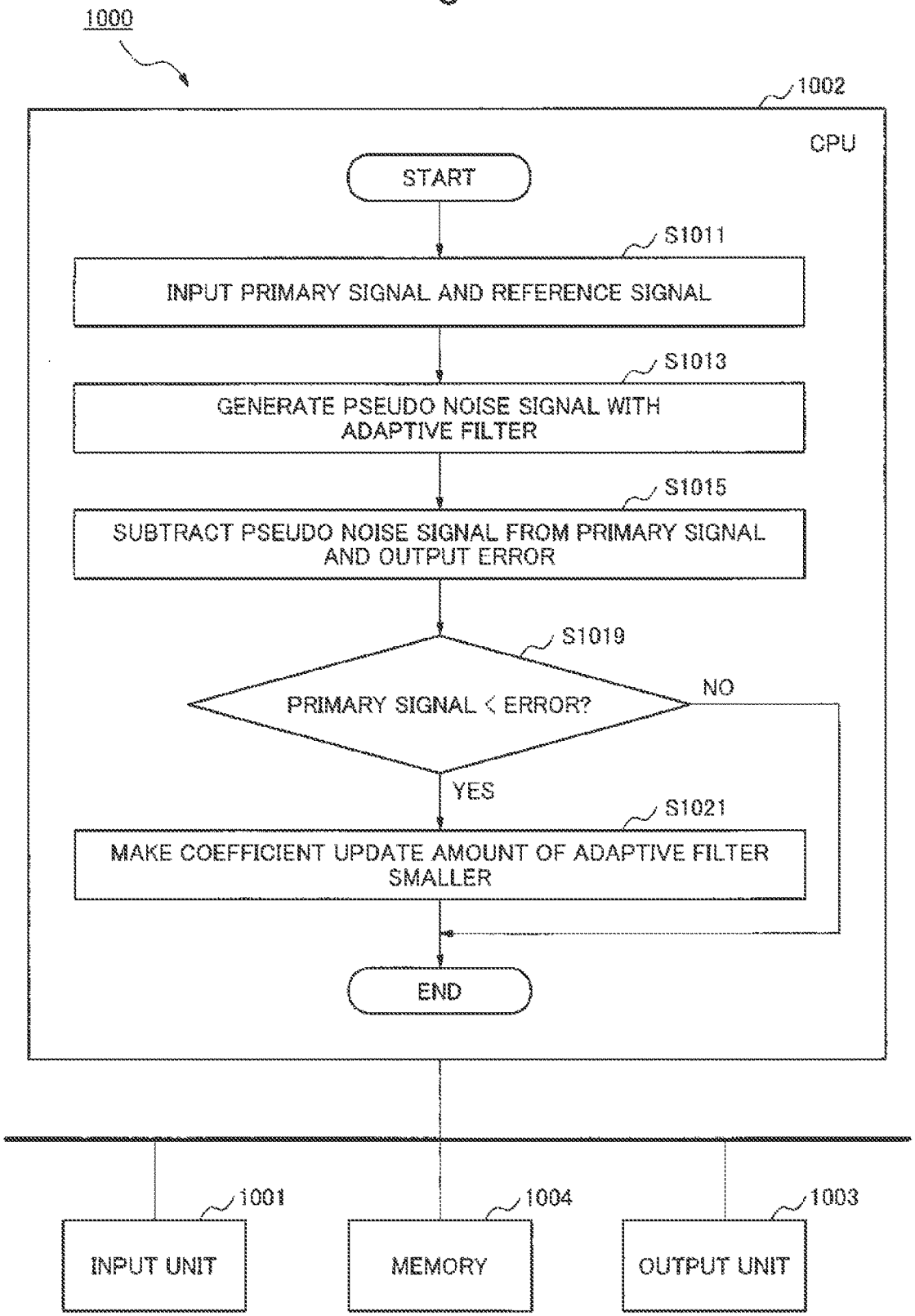

SIGNAL PROCESSING DEVICE, SIGNAL PROCESSING METHOD AND SIGNAL PROCESSING PROGRAM FOR NOISE CANCELLATION

CROSS REFERENCE TO RELATED APPLICATIONS

This application is a National Stage of International Application No. PCT/JP2011/071747, filed on Sep. 15, 2011, which claims priority from Japanese Patent Application No. 2010-228655, filed on Oct. 8, 2010, the contents of all of which are incorporated herein by reference in their entirety.

TECHNICAL FIELD

The present invention relates to a signal processing technology which cancels a noise, an interference signal, and an echo or the like mixed in a signal.

BACKGROUND ART

Background noise is often superimposed on a voice signal inputted from a microphone, and a hand set or the like, and it becomes a big problem when voice coding or speech recognition is performed. As a signal processing device which aimed at cancelling a noise superimposed acoustically, a two-input type noise cancellation device using two adaptive filters is disclosed in patent literatures 1 and 2. Using a signal to noise ratio in a primary signal estimated by using the first adaptive filter among two adaptive filters, a stepsize calculation unit calculates a coefficient-update stepsize of the second adaptive filter. The first adaptive filter operates like the second adaptive filter, but a value larger than the coefficient-update stepsize of the second adaptive filter is set to a coefficient-update stepsize of the first adaptive filter. For this reason, although the first adaptive filter has a high follow-up performance of output to an environmental variation, its estimation accuracy of the noise is inferior to the second adaptive filter.

The stepsize calculation unit, based on the signal to noise ratio in the primary signal estimated by using the first adaptive filter, assumes that interference by a voice signal is large when the voice signal is larger than the noise, and provides a small coefficient-update stepsize to the second adaptive filter. On the contrary, the step size calculation unit assumes that interference by the voice signal is small when the voice signal is smaller than the noise, and provides a large coefficient-update stepsize to the second adaptive filter. Thus, by controlling the second adaptive filter with the coefficient-update step size provided by the stepsize calculation unit, a noise-cancelled signal which accomplishes sufficient follow-up performance to the environmental variation and low distortion in the signal after noise cancellation, simultaneously.

Further, in patent literature 3, a structure of a noise cancellation device which, by extending a structure of patent literatures 1 and 2 mentioned above, also performs cancellation of the voice signal mixed in the background noise, when an influence of the voice signal mixed in a background noise is large, that is, a so-called crosstalk of the voice signal exists, is disclosed. In patent literature 3, in addition to the structure of patent literatures 1 and 2 mentioned above, a second stepsize calculation unit calculates the coefficient-update stepsize of the adaptive filter which cancels the voice signal from the noise input signal in order to cancel the background noise correctly from the voice signal input.

CITATION LIST

Patent Literature

[Patent Literature 1] Japanese Patent Application Laid-Open No. H10-215193
[Patent Literature 2] Japanese Patent Application Laid-Open No. 2000-172299
[Patent Literature 3] International publication number WO2005/024787 official bulletin

SUMMARY OF INVENTION

Technical Problem

However, in the noise cancellation device in patent literatures 1 to 3, the primary voice signal is delayed by the first adaptive filter and the second adaptive filter, and is inputted to a subtractor for noise cancellation. This represents that the noise-suppressed signal which is an output signal of the noise cancellation device is delayed from the inputted voice signal. Accordingly, in case this noise cancellation device is applied to a two-way communication, the communication becomes unnatural due to the delay of the voice signal. Also, since the noise cancellation device in patent literatures 1 to 3 needs the first adaptive filter for controlling the coefficient-update stepsize of the second adaptive filter, required processing cost also increases.

On the other hand, in case this delay is not applied in patent literatures 1 to 3, an estimated value of a desired-signal to noise ratio in the primary voice signal is obtained later than a correct value, the noise cancellation device in patent literatures 1 to 3 cannot perform correct coefficient-update stepsize control. Accordingly, a residual noise in the signal after noise cancellation increases and distortion of the output signal increases.

The object of the present invention is to provide a technology which solves the problems mentioned above.

Solution to Problem

To achieve the above object, a device according to an exemplary aspect of the invention includes first input means for inputting a first mixed signal in which a first signal and a second signal are mixed; second input means for inputting a second mixed signal in which the first signal and the second signal are mixed in a different proportion from the first mixed signal; first subtraction means for outputting an estimated first signal by subtracting a pseudo second signal from the first mixed signal; a first adaptive filter for generating the pseudo second signal by performing filter processing to the second mixed signal using a first coefficient updated by a first control signal; first compare means for comparing a value of the estimated first signal and a value of the first mixed signal; and first control means for outputting the first control signal to make an update amount of the first coefficient smaller as compared with a case when a value of the estimated first signal is smaller than the first mixed signal, to the first adaptive filter, in case a value of the estimated first signal is larger than a value of the first mixed signal as a result of comparison by the first compare means.

To achieve the above object, a method according to an exemplary aspect of the invention includes generating an estimated first signal by subtracting a pseudo second signal which is estimated to be mixed in a first mixed signal in which a first signal and a second signal are mixed from the first mixed signal; obtaining the pseudo second signal which is estimated to be mixed in the first mixed signal by performing filter processing to a second mixed signal in which the first signal and the second signal are mixed in a different proportion from the first mixed signal, using a coefficient of a first adaptive filter updated by a first control signal; and outputting the first control signal to make an update amount of the coefficient of the first adaptive filter smaller as compared with a case when the estimated first signal is smaller than the first mixed signal, to the first adaptive filter, in case the estimated first signal is larger than the first mixed signal.

To achieve the above object, a program according to an exemplary aspect of the invention causes a computer to execute a step which generates an estimated first signal by subtracting a pseudo second signal which is estimated to be mixed in a first mixed signal in which a first signal and a second signal are mixed from a first mixed signal; and a step which obtains the pseudo second signal which is estimated to be mixed in the first mixed signal by performing filter processing to a second mixed signal in which the first signal and the second signal are mixed in a different proportion from the first mixed signal, using a coefficient of a first adaptive filter updated by a first control signal, and outputs the first control signal to make an update amount of the coefficient of the first adaptive filter smaller as compared with a case when the estimated first signal is smaller than the first mixed signal, to the first adaptive filter, in case the estimated first signal is larger than the first mixed signal.

Advantageous Effect of the Invention

According to the present invention, it is possible, from a mixed signal in which a first signal and a second signal are mixed, to remove the second signal at low processing cost and without delay, and as a result, to obtain an estimated first signal which has low residue of the second signal and low distortion.

BRIEF DESCRIPTION OF DRAWINGS

FIG. 10 A block diagram showing a structure of a computer according to other exemplary embodiment of the present invention.

DESCRIPTION OF EMBODIMENTS

Hereinafter, exemplary embodiments of the present invention will be described illustratively and in detail with reference to drawings. However, components indicated in the following exemplary embodiments are provided for illustrated purposes only and are not intended to limit the technological scope of the present invention to them.

First Exemplary Embodiment

A signal processing device 100 as a first exemplary embodiment of the present invention will be described using FIG. 1. The signal processing device 100 of FIG. 1 is a device which obtains, from a first mixed signal $x_p(k)$ in which a first signal and a second signal are mixed, an estimated first signal $e(k)$ as an estimated value of the first signal.

Figure 1:
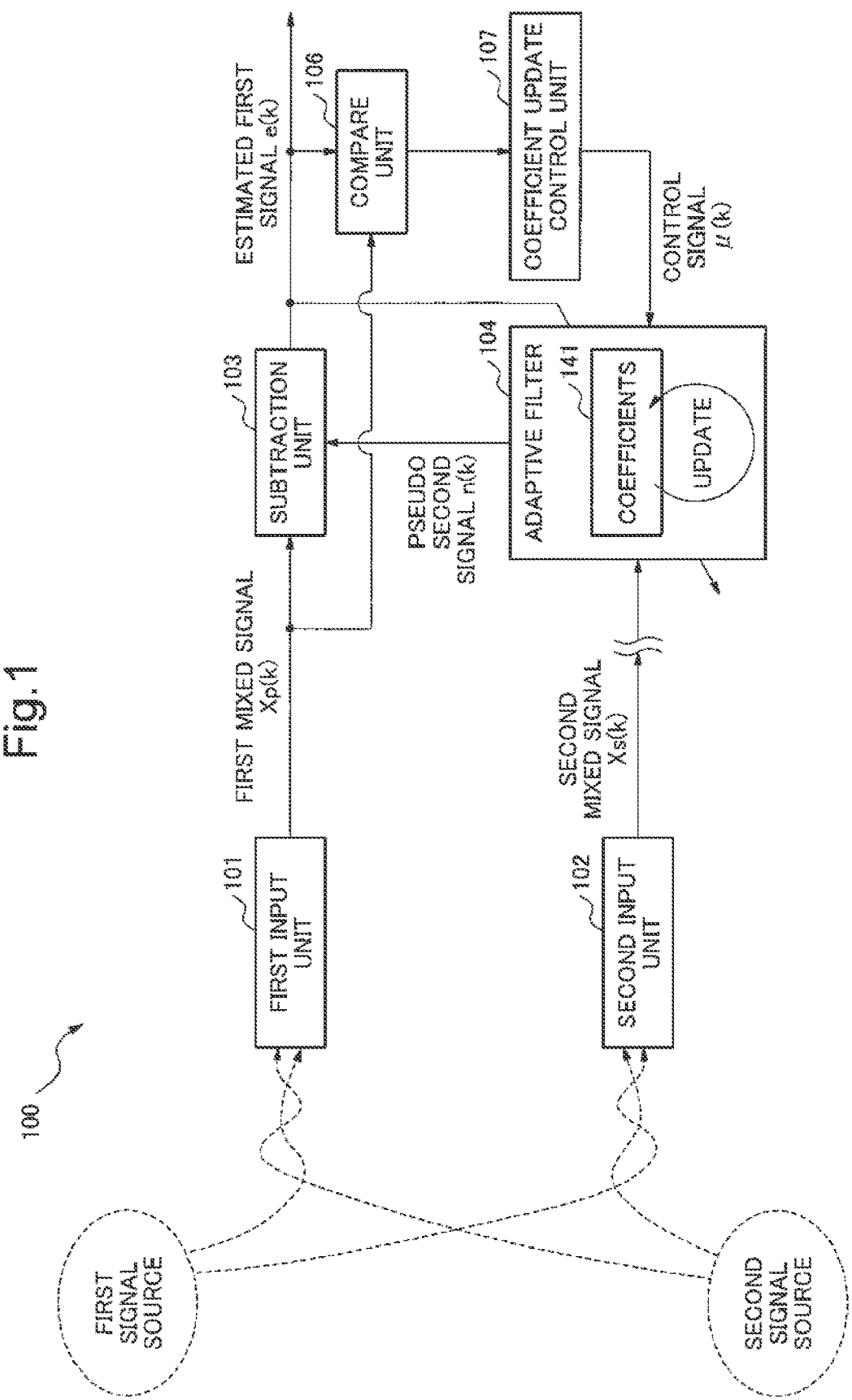
FIG. 1 A block diagram showing a structure of a signal processing device according to a first exemplary embodiment of the present invention.

As shown in FIG. 1, the signal processing device 100 includes a first input unit 101, a second input unit 102, a subtraction unit 103, an adaptive filter 104, a compare unit 106 and a coefficient-update control unit 107.

The first input unit 101 inputs the first mixed signal $x_p(k)$ in which the first signal and the second signal are mixed. The second input unit 102 inputs a second mixed signal $x_s(k)$ in which the first signal and the second signal are mixed in a different proportion from the first mixed signal $x_p(k)$.

The subtraction unit 103 subtracts a pseudo second signal $n(k)$ which is estimated to be mixed in the first mixed signal $x_p(k)$ from the first mixed signal $x_p(k)$ and outputs the estimated first signal $e(k)$. And in order to obtain the pseudo second signal $n(k)$, the adaptive filter 104 performs filter processing to the second mixed signal $x_s(k)$ or a signal based on the second mixed signal $x_s(k)$ with coefficients 141 updated based on the estimated first signal $e(k)$.

The compare unit 106 compares a value of the first mixed signal $x_p(k)$ and a value of the estimated first signal $e(k)$. The coefficient-update control unit 107 outputs a control signal $\mu(k)$ to make an update amount of the coefficients 141 of the adaptive filter 104 smaller, to the adaptive filter 104, in case the value of the estimated first signal $e(k)$ is larger than the value of the first mixed signal $x_p(k)$ as a result of comparison by the compare unit 106.

According to this exemplary embodiment with such a structure, it is possible to remove the second signal from the mixed signal in which the first signal and the second signal are mixed at low processing cost and without delay, and as a result, to obtain the estimated first signal which has low residue of the second signal and low distortion.

Second Exemplary Embodiment

As a signal processing device according to a second exemplary embodiment of the present invention, a noise cancellation device which cancels a part or all of the noise from a deteriorated signal (a signal in which a desired-signal and noise are mixed), and outputs an emphasized signal (a signal in which the desired-signal is emphasized) is described. Here, the deteriorated signal corresponds to the first mixed signal in which the first signal and the second signal are mixed, and the emphasized signal corresponds to a desired voice signal (estimated first signal).

(Explanation of a Basic Technology of Noise Cancellation)

Hereinafter, a basic technology of noise cancellation for cancelling a noise, an interference signal, and an echo or the like, which are mixed with the desired-signal inputted from a microphone, a hand set, and a channel or the like by the adaptive filter, or emphasizing the desired-signal will be described briefly.

As disclosed in patent literatures 1 to 3, the two-input type noise cancellation device generates a pseudo noise (pseudo second signal) corresponding to a noise component which is mixed with a voice at a voice input terminal from a reference signal by using the adaptive filter which approximates an impulse response of an acoustic path from a noise source to the voice input terminal. And the noise cancellation device operates in such a way that the noise component is suppressed by subtracting this pseudo noise from the signal inputted to the voice input terminal (first mixed signal). Here, the mixed signal is a signal in which the voice signal and the noise are mixed and is generally supplied from a microphone or a hand set to the voice input terminal. Also, the reference signal is a signal which has a correlation with the noise component in the noise source and is captured at a location close to the noise source. Since the reference signal is captured at a location close to the noise source as above, it is possible to assume that the reference signal is almost equal to the noise component at the noise source. The reference signal supplied to a reference input terminal is inputted to the adaptive filter.

The coefficients of the adaptive filter are modified based on a correlation between an error obtained by subtracting the pseudo noise from the received signal and the reference signal inputted to the reference input terminal. As a coefficient modification algorithm of such adaptive filter, an "LMS algorithm (Least Mean-Square Algorithm)" and an "LIM (Learning Identification Method)" are disclosed in patent literatures 1 to 3. The LIM is also referred to as a normalized LMS algorithm.

The LMS algorithm and the LIM are one of algorithms called a gradient method. Speed and precision of coefficient update depend on a constant called a coefficient-update stepsize. The filter coefficients are updated by a product of the coefficient-update stepsize and the error. The desired-signal included in the error interferes with coefficient update. In order to reduce its influence, a very small value needs to be set to the coefficient-update stepsize. In patent literatures 1 to 3 mentioned above, the follow-up performance to the environmental variation of the adaptive filter coefficients decreases in case the coefficient-update stepsize is small. Therefore patent literatures 1 to 3 disclose one method to solve the problem such as increasing of the error or occurring of the distortion of the desired-signal.

(Structure of a Noise Cancellation Device of the Second Exemplary Embodiment)

Figure 2:
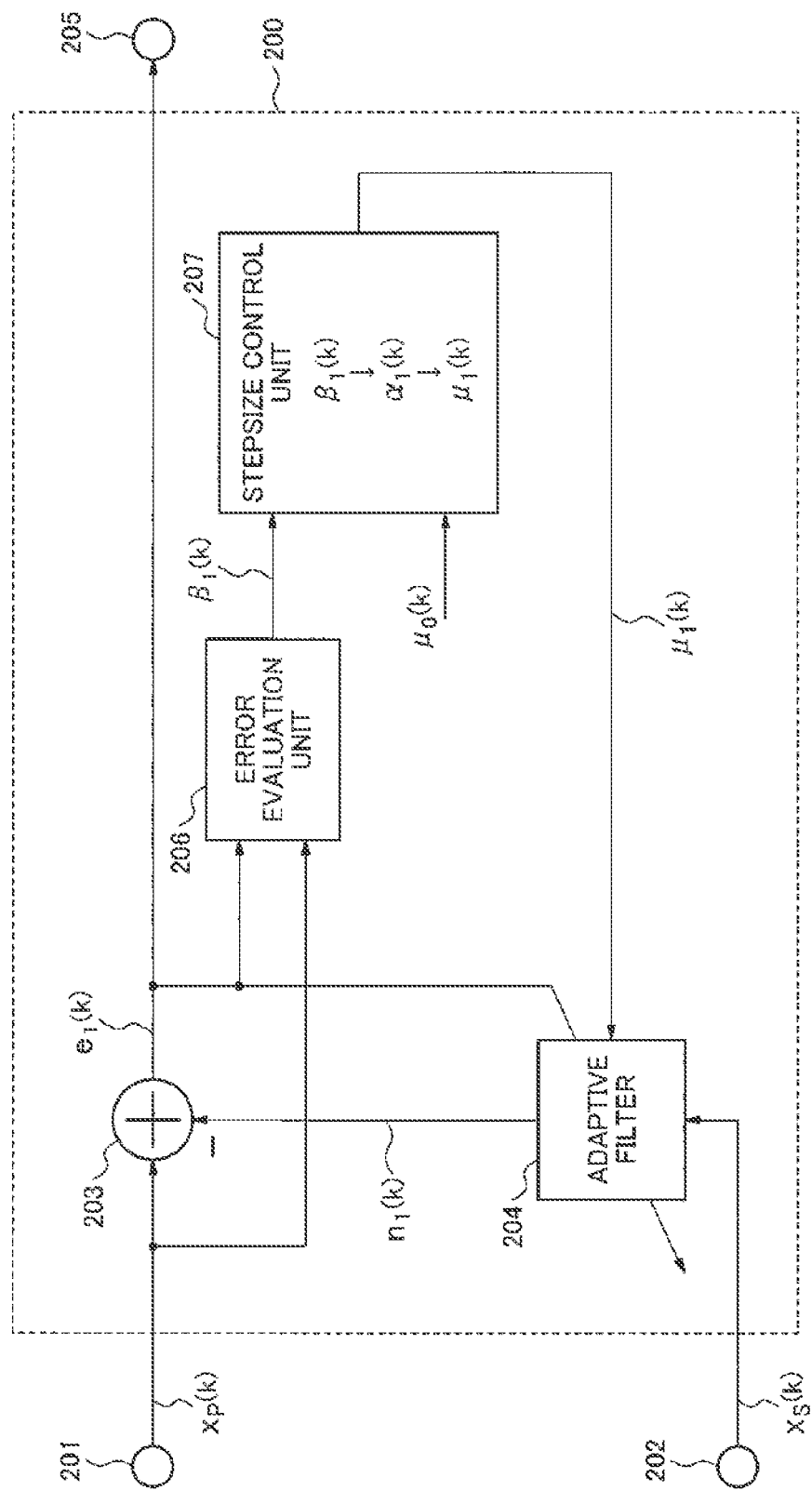
FIG. 2 A block diagram showing a structure of a signal processing device according to a second exemplary embodiment of the present invention.

FIG. 2 is a block diagram showing an entire structure of a noise cancellation device 200 of the second exemplary embodiment. Although the noise cancellation device 200 also functions as a part of a device, for example, such as a digital camera, a laptop computer, and a cellular phone, the present invention is not limited to this, and can be applied to any information processing device for which noise cancellation from an input signal is required.

As shown in FIG. 2, a primary signal (first mixed signal) $x_p(k)$ in which a voice and a noise are mixed is inputted from an input terminal 201 to the noise cancellation device 200. And a reference signal (second mixed signal) $x_s(k)$ in which the voice and the noise are mixed is inputted from an input terminal 202 to the noise cancellation device 200. Also, the noise cancellation device 200 outputs an estimated desired-signal $e_1(k)$ to an output terminal 205. Also, the noise cancellation device 200 includes an adaptive filter 204, a subtractor 203, an error evaluation unit 206 and a stepsize control unit 207. The noise cancellation device 200 generates a pseudo noise $n_1(k)$ by transforming the reference signal $x_s(k)$, which has a correlation with the noise to be cancelled, with the adaptive filter 204, and cancels the noise by subtracting this from the primary signal $x_p(k)$ on which the noise is superimposed. The noise cancellation device 200 performs coefficient update of the adaptive filter 204 based on the estimated desired-signal (output) $e_1(k)$ after subtraction, compares the signal before and after subtraction, and when the primary signal $x_p(k)$ before subtraction is larger than the estimated desired-signal $e_1(k)$ after subtraction, judges that it is in an abnormal situation and makes a coefficient update amount $\mu_1(k)$ smaller.

The primary signal $x_p(k)$ is supplied to the input terminal 201 as a series of sample values. The primary signal $x_p(k)$ is transmitted to the subtractor 203 and the error evaluation unit 206. The reference signal $x_s(k)$ is supplied to the input terminal 202 as a series of sample values. The reference signal $x_s(k)$ is transmitted to the adaptive filter 204.

The adaptive filter 204 performs convolution operation of the reference signal $x_s(k)$ and the filter coefficients and transmits the result to the subtractor 203 as the pseudo noise $n_1(k)$.

To the subtractor 203, the primary signal $x_p(k)$ is supplied from the input terminal 201 and the pseudo noise $n_1(k)$ is supplied from the adaptive filter 204. The subtractor 203 subtracts the pseudo noise $n_1(k)$ from the primary signal $x_p(k)$ and transmits the result to the output terminal 205 and the error evaluation unit 206 as the estimated desired-signal and, at the same time, feeds it back to the adaptive filter 204.

The primary signal and the estimated desired-signal are supplied to the error evaluation unit 206. The error evaluation unit 206 compares the primary signal and the estimated desired-signal and outputs an evaluation result $\beta_1(k)$ decided by their magnitude relation. The easiest determination method of the evaluation result $\beta_1(k)$ is a method which uses $\beta_1(k)=1$ when a square value of the output $e_1^2(k)$ is larger than a square value of the primary signal $x_p^2(k)$, and $\beta_1(k)=0$ when the output is smaller than the primary signal. As equivalent processing, the evaluation result $\beta_1(k)$ may be determined by obtaining a ratio $\Gamma(k)$ of the primary signal and the output and comparing a value of the ratio and a threshold value $\delta_0$ set in advance. That is, the error evaluation unit 206 may use $\beta_1(k)=1$ if $\Gamma(k) \geq \delta_0$, and $\beta_1(k)=0$ if $\Gamma(k) < \delta_0$ for the following (Equation 1).

$$\Gamma(k) = x_p^2(k)/e_1^2(k) \qquad \text{(Equation 1)}$$

The error evaluation unit 206 can also get a similar effect by using an absolute value of the primary signal $x_p(k)$ instead of the square value of the primary signal $x_p(k)$. Note that, here, although 1 and 0 are used as a value of the evaluation result $\beta_1(k)$, the present invention is not limited to this, and as far as two different states of the output can be expressed, any kind of expression can be used. For example, the value of $\beta_1(k)$ may be 10 and 0, or +1 and −1 and so on.

Although the determination method described so far compares $\Gamma(k)$ with the threshold value and performs a two-level decision with 1 or 0 (a hard decision), the error evaluation unit 206 may apply a soft decision. For example, in case $\delta_0 + \delta_1$ is set to an upper limit threshold value of the soft decision and $\delta_0 - \delta_2$ is set to a lower limit threshold value, the error evaluation unit 206 may use $\beta_1(k)=1$ when $\Gamma(k)$ exceeds the upper limit threshold value, $\beta_1(k)=0$ when $\Gamma(k)$ is less than the lower limit threshold value, and $\beta_1(k)$ between 1 and 0 when $\Gamma(k)$ takes a value between the lower limit threshold value and the upper limit threshold value. That is, $\beta_1(k)$ may be obtained by the following equation (Equation 2).

$$\beta_1(k)=\Gamma(k)/(\delta_1+\delta_2)+(\delta_2-1)/(\delta_0+\delta_2) \quad \text{(Equation 2)}$$

Although (Equation 2) is a equation providing a linear interpolation between the upper limit threshold value and the lower limit threshold value, $\beta_1(k)$ may be specified by a more complicated arbitrary function or a polynomial equation. The evaluation result $\beta_1(k)$ calculated by either one of the methods described so far is transmitted to the step size control unit 207.

The evaluation result $\beta_1(k)$ is supplied from the error evaluation unit 206 to the stepsize control unit 207. The stepsize control unit 207 obtains a coefficient update amount adjustment value $\alpha_1(k)$ according to the value of the evaluation result $\beta_1(k)$ supplied from the error evaluation unit 206 and finally sets a value according to the error to a coefficient-update stepsize $\mu_1(k)$.

The coefficient update amount adjustment value $\alpha_1(k)$ is a function of the evaluation result $\beta_1(k)$, and is expressed as the following (Equation 3) using the function $\Psi_1$.

$$\alpha_1(k)=\Psi_1\{\beta_1(k)\} \quad \text{(Equation 3)}$$

Function $\Psi_1$ is set in such a way that a value of the coefficient update amount adjustment value $\alpha_1(k)$ becomes small when a value of the evaluation result $\beta_1(k)$ is large, and $\alpha_1(k)$ becomes large when a value of the evaluation result $\beta_1(k)$ is small. Note that, $0\le\alpha_1(k)\le 1$. For example, it may be set such that $\alpha_1(k)=0.125$ for $\beta_1(k)=1$ and $\alpha_1(k)=1$ for $\beta_1(k)=0$.

The stepsize control unit 207 obtains the final coefficient-update step size $\mu_1(k)$ by multiplying an original coefficient update amount $\mu_0$ (constant) by the coefficient update amount adjustment value $\alpha_1(k)$, and supplies it to the adaptive filter 204. That is, the coefficient-update step size $\mu_1(k)$ is expressed as the following (Equation 4).

$$\mu_1(k)=\mu_0\times\alpha_1(k) \quad \text{(Equation 4)}$$

The adaptive filter 204 update coefficients using $\mu_1(k)$ supplied from the stepsize control unit 207 as the coefficient-update stepsize. The adaptive filter 204 can make the coefficient update amount smaller by using the coefficient update amount obtained through adjusting the original coefficient update amount $\mu_0$ with the coefficient update amount adjustment value $\alpha_1(k)$. In particular, $\alpha_1(k)=0$ represents suspending of the coefficient update and $\alpha_1(k)=1$ represents a state where the stepsize control unit 207 does not have any influence on the coefficient update at all.

The reason why robustness to the interference signal is increased and signal processing which has minimum residual noise and low distortion of the output signal can be realized by making the coefficient update amount smaller is indicated below. First, the reference signal is represented by $x_s(k)$ and the output of the adaptive filter 204 is represented by $n_1(k)$. Also, a noise source signal is represented as $n_0(k)$, a voice source signal is represented by $S(k)$ and a characteristic vector (impulse response) of the acoustic path from the noise source to the input terminal 201 is represented by $H_1$. In order to make explanation simple, this acoustic path is supposed to be time invariant, and sample number k corresponding to a concept of time is omitted. Then, a coefficient vector of the adaptive filter is described as $W(k)$, number of taps thereof is described as M, a noise source signal vector including a time series sample of the noise source signal $n_0(k)$ is described as $N_0(k)$, and an element of the characteristic vector in the acoustic path is described as $h_1(j)$, $j=0, 1 \ldots M-1$. In this case, $W(k)$, $N_0(k)$ and $H_1$ are expressed as the following equations. Here, $[\ ]^T$ expresses transposition of a matrix.

$$W(k)=[w(k,0),w(k,1),\ldots,w(k,M-1)]^T \quad \text{(Equation 5)}$$

$$N_0(k)=[n_0(k),n_0(k-1),\ldots,n_0(k-M+1)]^T \quad \text{(Equation 6)}$$

$$H_1=[h_1(0),h_1(1),\ldots,h_1(M-1)]^T \quad \text{(Equation 7)}$$

Since the primary signal $x_p(k)$ is expressed as the following (Equation 8), the output $e_1(k)$ of the subtractor 203 can be expressed as (Equation 9).

$$x_p(k)=S(k)+H_1^T*N_0(k) \quad \text{(Equation 8)}$$

$$e_1(k)=x_p(k)-n_1(k)=S(k)+H_1^T*N_0(k)-W^T(k)*N_0(k)=$$
$$S(k)+\{H_1^T-W^T(k)\}*N_0(k) \quad \text{(Equation 9)}$$

Here, * represents a convolution operation. In the right-hand side of (Equation 9), the second term can be minimized by updating the coefficient vector $W(k)$ of the adaptive filter 204. $S(k)$ behaves independently of the second term and is an interference signal to the second term. That is, when the first term of the right-hand side is not small enough compared with the second term of the right-hand side, the coefficient update using $e_1(k)$ is not performed correctly. Accordingly, it is effective to detect that the first term of the right-hand side is not small enough compared with the second term of the right-hand side and make the coefficient update amount smaller.

In this exemplary embodiment, the magnitude relation between $x_p(k)$ and $e_1(k)$ is used for this detection. First, $S(k)=0$ for simplicity. In this case, the following equations hold.

$$x_p(k)=H_1^T*N_0(k) \quad \text{(Equation 10)}$$

$$e_1(k)=\{H_1^T-W^T(k)\}*N_0(k) \quad \text{(Equation 11)}$$

When the coefficient vector $W(k)$ of the adaptive filter 204 approximates the characteristic vector $H_1$ of the acoustic path to a certain extent, polarities of them are identical. Also, since setting 0 to the coefficient vector $W(k)$ as an initial value is a general way of use of the adaptive filter, and considering that $|w(k,j)|>0$, $j=0, 1, \ldots, M-1$, the following (Equation 12) holds based on (Equation 10) and (Equation 11).

$$x_p^2(k)>e_1^2(k) \quad \text{(Equation 12)}$$

If (Equation 12) does not hold, the reason is that the assumption $S(k)=0$ is wrong. That is, $S(k)\ne 0$. Accordingly, by detecting that an opposite condition of (Equation 12), that is, detecting that the following (Equation 13) holds, it is possible to know whether an interference signal $S(k)$ is zero.

$$x_p^2(k)<e_1^2(k) \quad \text{(Equation 13)}$$

On the other hand, especially just after the coefficient update has been started, the coefficient vector $W(k)$ may hardly approximate the characteristic vector $H_1$ of the acoustic path. In this case, a probability that polarities of the coefficient vector $W(k)$ and the characteristic vector $H_1$ of acoustic path are identical starts from 0.5 and comes close to 1 as the coefficient vector converges to the correct value. Accordingly, it can be considered that a probability that detecting the interference signal $S(k)$ using (Equation 13) is correct also starts from 0.5 and comes close to 1. Considering that the existence of the interference signal $S(k)$ has a decisive bad influence on the coefficient update, misdetection is more desirable than no detection. Accordingly, even when the coefficient vector W(k) hardly approximates the characteristic vector $H_1$ of the acoustic path, that is, just after the coefficient update, the detection of the interference signal S(k) using (Equation 13) is effective.

In the description so far, a square value is used for each of the primary signal and the output. However, a similar effect can also be obtained by using an absolute value instead of the square value for each of the primary signal and the output.

According to this exemplary embodiment, with the structure mentioned above, signal processing which has strong robustness to the interference signal, low residual noise and low distortion of the output signal can be realized. In particular, by detecting the interference signal S(k) using (Equation 13) and making the coefficient update amount smaller when signal S(k) is detected, high robustness can be achieved at low processing cost.

Third Exemplary Embodiment

A third exemplary embodiment of the present invention will be described using FIG. 3. The error evaluation unit 206 according to the second exemplary embodiment compares the primary signal $x_p(k)$ and the estimated desired-signal $e_1(k)$ without any additional operation on them and evaluates the error. In contrast, an error evaluation unit 306 of this exemplary embodiment averages either one or both of the primary signal $x_p(k)$ and the estimated desired-signal $e_1(k)$ and uses them for evaluation of the error. The error evaluation unit 306 can absorb statistical uncertainty of the signal and obtain more correct evaluation result $\beta_1(k)$ by using the average values. The average values can be calculated using the average based on an FIR filter (a moving average using a sliding window), the average based on an IIR filter (leaky integration) and so on. When the average value of the estimated desired-signal $e_1^2(k)$ is represented by $e_1^2(k)$ bar, then $e_1^2(k)$ bar can be described as the next (Equation 14).

$$e_1^2(k)\text{bar} = (1/R) \cdot \sum_{r=0}^{R-1} e_1^2(r) \qquad \text{(Equation 14)}$$

wherein, R is a natural number representing a number of samples (window size) used to obtain the average value. When the average value is obtained by the leaky integration operation, $e_1^2(k)$ bar is expressed as the next (Equation 15).

$$e_1^2(k)\text{bar} = \gamma \cdot e_1^2(k-1)\text{bar} + (1-\gamma) \cdot e_1^2(k) \qquad \text{(Equation 15)}$$

wherein, $\gamma$ is a constant which satisfies $0<\gamma<1$. In the same way, $x_p^2(k)$ bar can also be obtained. The error evaluation unit 306 uses $e_1^2(k)$ bar and $x_p^2(k)$ bar obtained in this way instead of $e_1^2(k)$ and $x_p^2(k)$ of (Equation 13).

Figure 3:
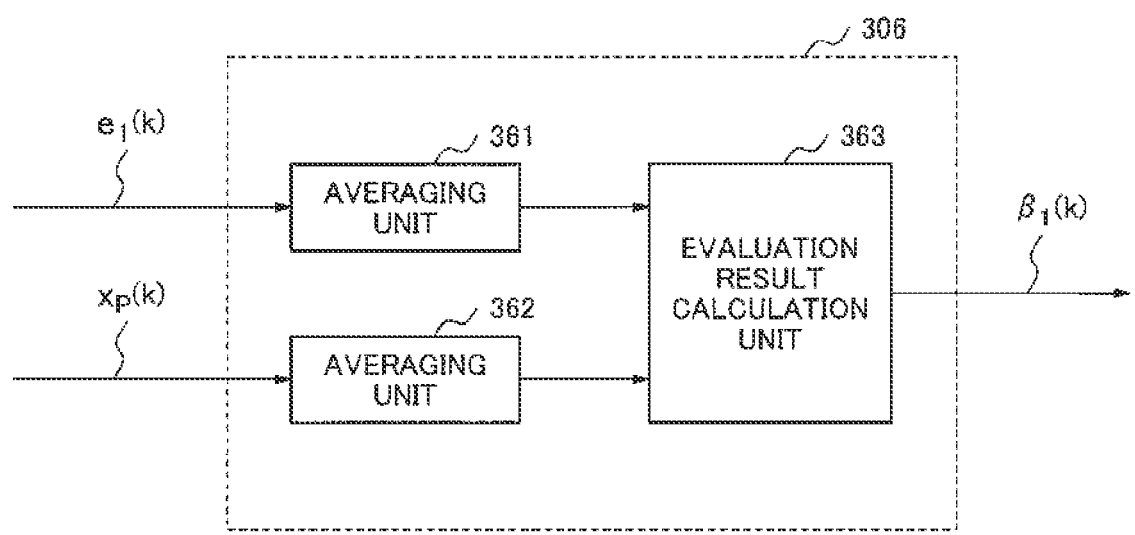
FIG. 3 A block diagram showing a structure of an error evaluation unit according to a third exemplary embodiment of the present invention.

FIG. 3 is a block diagram showing an internal structure of the error evaluation unit 306 according to this exemplary embodiment. Here, the error evaluation unit 306 includes averaging units 361 and 362 and an evaluation result calculation unit 363. The averaging unit 361 receives the estimated desired-signal $e_1(k)$, obtains its square values, averages them and supplies them to the evaluation result calculation unit 363. The averaging unit 361 may obtain the absolute values of the estimated desired-signal $e_1(k)$ instead of the square values, average them, and supply them to the evaluation result calculation unit 363. As a special case for them, the averaging unit 361 can supply an instantaneous value of the square value or the absolute value to the evaluation result calculation unit 363 by averaging each sample. The averaging unit 362 performs the same operation as the averaging unit 361 for the primary signal $x_p(k)$, and output of the averaging unit 362 is supplied to the evaluation result calculation unit 363 similarly.

Averaging operation can be realized by averaging using a sliding window or leaky integration. When the average value of the estimated desired-signal $e_1(k)$ (estimated first signal average value) and the average value of primary signal $x_p(k)$ (first mixed signal average value) are represented by $e_1^2(k)$ bar and $x_p^2(k)$ bar respectively, $e_1^2(k)$ bar which is the output of the averaging unit 361 is indicated as (Equation 14) or (Equation 15). Values of R and $\gamma$ may be different from values used in (Equation 14) or (Equation 15). Also, $x_p^2(k)$ bar which is the output of the averaging unit 362 can be described as the following (Equation 16) or (Equation 17).

$$x_p^2(k)\text{bar} = (1/R) \cdot \sum_{r=0}^{R-1} x_p^2(r) \qquad \text{(Equation 16)}$$

$$x_p^2(k)\text{bar} = \gamma \cdot x_p(k-1)\text{bar} + (1-\gamma) \cdot x_p^2(k) \qquad \text{(Equation 17)}$$

The values R and $\gamma$ in these equations can also be decided independently from the values used in (Equation 14) or (Equation 15) or the calculation of $e_1^2(k)$ bar mentioned above.

The evaluation result calculation unit 363 receives the output power average value $e_1^2(k)$ bar and the primary signal power average value $x_p^2(k)$ bar which are the outputs of the averaging unit 361 and the averaging unit 362 and calculates an evaluation result $\Gamma(k)$ as shown in the following (Equation 18).

$$\Gamma(k) = x_p^2(k)\text{bar}/e_1^2(k)\text{bar} \qquad \text{(Equation 18)}$$

Also, as shown in the following (Equation 19), a logarithm of the right-hand side of (Equation 18) may be defined as $\Gamma(k)$.

$$\Gamma(k) = \log_{10}(x_p^2(k)\text{bar}/e_1^2(k)\text{bar}) \qquad \text{(Equation 19)}$$

$\beta_1(k)$ is determined similarly to the second exemplary embodiment using $\Gamma(k)$ obtained by (Equation 18) or (Equation 19). $\beta_1(k)$ is supplied to the stepsize control unit 207.

With the error evaluation using the average values shown above, it is possible to absorb statistical uncertainty of the signal and obtain more correct evaluation result $\beta_1(k)$.

Fourth Exemplary Embodiment

A noise cancellation device 400 as a fourth exemplary embodiment of the present invention will be described using FIG. 4. Compared with the second exemplary embodiment, the noise cancellation device 400 according to this exemplary embodiment differs from the second exemplary embodiment in that a SNR (Signal-Noise Ratio) estimation unit 408 is included and the stepsize control unit 207 is replaced by a stepsize control unit 407. Since the other components are similar to those of the second exemplary embodiment, the same reference sign is used for the similar component and its description will be omitted.

Figure 4:
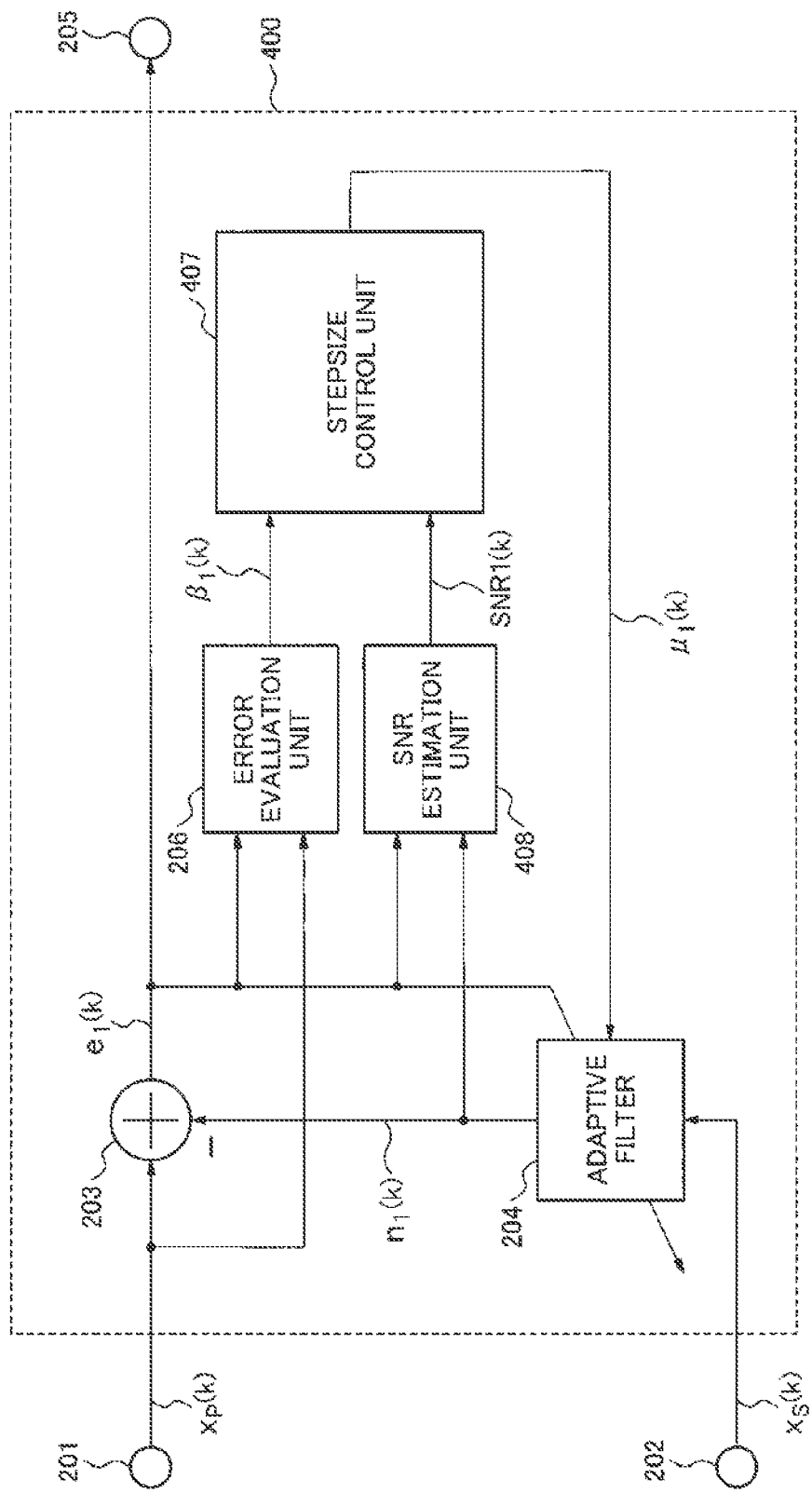
FIG. 4 A block diagram showing a structure of a signal processing device according to a fourth exemplary embodiment of the present invention.

In FIG. 4, the SNR estimation unit 408 functions as a ratio output unit which obtains a ratio of the estimated desired-signal $e_1(k)$ to a pseudo noise signal $n_1(k)$ which is an output of the adaptive filter 204, as an SNR estimated value SNR1($k$). The noise cancellation device 400 can use the estimated desired-signal $e_1(k)$ as an estimated value of the voice source signal S(k). Also, the noise cancellation device 400 can use the pseudo noise signal $n_1(k)$ as an estimated value of the noise component $H_1^{T}*N_0(k)$ included in the primary signal. Accordingly, the SNR estimation unit 408 can use a ratio of them as a first SNR estimated value.

The step size control unit 407 calculates the coefficient update amount $\mu_1(k)$ by the following equation and transmits it to the adaptive filter 204.

$$\mu_1(k)=\mu_0 \cdot \alpha_1(k) \cdot m1(k) \quad \text{(Equation 20)}$$

$$m1(k)=\Phi_1\{SNR1(k)\} \quad \text{(Equation 21)}$$

Having high of the SNR estimated value SNR1($k$) means that power of the voice source signal S(k) is large. Therefore the function $\Phi_1\{\ \}$ is designed in such a way that a value of $\mu_1(k)$ becomes smaller when SNR is high, and a value of $\mu_1(k)$ becomes larger when SNR is low. That is, it is advisable to use a monotonic decreasing function which gives a small value when a value of SNR1($k$) is large and gives a large value when a value of SNR1($k$) is small, as the function $\Phi_1\{\ \}$. Also, its range is defined as $m1_{min} \leq m1(k) \leq m1_{max}$. Note that, $m1_{min}$ and $m1_{max}$ are constants which satisfy $m1_{min} < m1_{max}$.

The stepsize control unit 407 determines a value of $\mu_1(k)$ as $\mu_0 \cdot \alpha_1(k)$ based on the signal $\alpha_1(k)$ supplied from the error evaluation unit 206, as described in the second exemplary embodiment. The stepsize control unit 407 further adjusts the value of $\mu_1(k)$ determined in this way with a value of $m1(k)=\Phi_1\{SNR1(k)\}$ based on the SNR estimated value SNR1($k$) supplied from the SNR estimation unit 408.

The simplest example of the function $\Phi_1\{\ \}$ is a downward sloping straight line, and it can be expressed by (Equation 22) to (Equation 24).

$$m1(k)=m1_{max} \ (m1_{max}<\Phi_1\{SNR1(k)\}) \quad \text{(Equation 22)}$$

$$m1(k)=\Phi_1\{SNR1(k)\}(m1_{min} \leq \Phi_1\{SNR1(k)\} \leq m1_{max}) \quad \text{(Equation 23)}$$

$$m1(k)=m1_{min} \ (m1_{min}>101_1\{SNR1(k)\}) \quad \text{(Equation 24)}$$

When values of SNR1 corresponding to the range $m1_{min}$ and $m1_{max}$ are represented by $SNR1_{min}$ and an upper limit value $SNR1_{max}$ respectively, the monotonic decreasing function $\Phi_1\{SNR1(k)\}$ can be expressed, for example, by the following (Equation 25) to (Equation 27).

$$\Phi_1\{SNR1(k)\}=-A \cdot SNR1(k)+B \quad \text{(Equation 25)}$$

$$A=(m1_{max}-m1_{min})/(SNR1_{max}-SNR1_{min}) \quad \text{(Equation 26)}$$

$$B=\{m1_{max}+m1_{min}+A \cdot (SNR1_{max}+SNR1_{min})\}/2 \quad \text{(Equation 27)}$$

In order to obtain small $m1(k)$ when SNR1($k$) is large, and in order to obtain large $m1(k)$ when SNR1($k$) is small, the monotonic decreasing function is used. Accordingly, other than the linear function shown in (Equation 25) to (Equation 27), a nonlinear function such as a polynomial function or a trigonometric function or a more complicated function expressed by their combination, and so on may be used. Through the procedure mentioned above, the stepsize control unit 407 outputs $\mu_1(k)$ obtained by (Equation 20) as the stepsize.

The adaptive filter 204 updates coefficients using $\mu_1(k)$ supplied from the stepsize control unit 407 as the coefficient-update stepsize. The adaptive filter 204 can make the coefficient update amount smaller when the interference signal to the coefficient update exists, by using the coefficient-update stepsize adjusted with $\alpha_1(k)$ and SNR1($k$) as shown by (Equation 20).

According to this exemplary embodiment, with the structure mentioned above, signal processing which has strong robustness to the interference signal, low residual noise, and low distortion of the output signal can be realized.

Fifth Exemplary Embodiment

A noise cancellation device 500 as a fifth exemplary embodiment of the present invention will be described using FIG. 5. Compared with the second exemplary embodiment, the noise cancellation device 500 according to this exemplary embodiment receives a signal in which a near-end signal (near-end voice) and an echo are mixed as the primary signal $x_p(k)$. Also the noise cancellation device 500 receives a far-end signal which causes echo as the reference signal $x_s(k)$. And the noise cancellation device 500 cancels the echo in the primary signal by generating a pseudo echo by the adaptive filter 204 and subtracting this from the primary signal.

Figure 5:
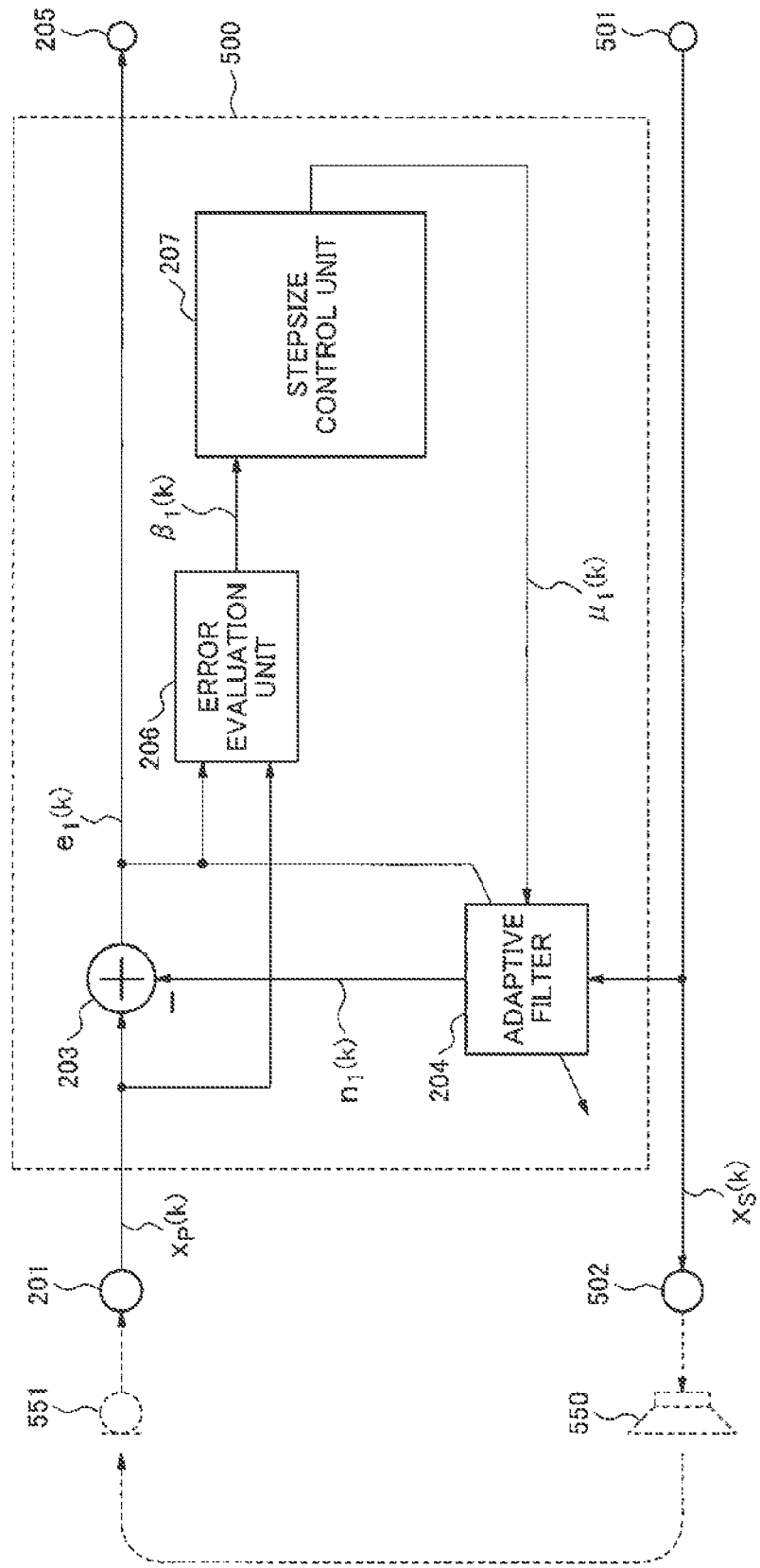
FIG. 5 A block diagram showing a structure of a signal processing device according to a fifth exemplary embodiment of the present invention.

In FIG. 5, it differs from the second exemplary embodiment in that the input terminal 202 is replaced by an output terminal 502 and, in addition, the input of the adaptive filter 204 is supplied from an input terminal 501. The far-end signal supplied to the input terminal 501 is supplied to the adaptive filter 204 and, at the same time, is also supplied to the output terminal 502. The output terminal 502 is connected to a speaker 550, and a wraparound signal to a microphone 551 connected to the input terminal 201 becomes the echo, consequently. Accordingly, the noise cancellation device 500 according to this exemplary embodiment operates as an echo cancellation device for cancelling the echo instead of the noise. Since the other components are similar to those of the second exemplary embodiment, the same reference sign is used for the similar component and its description will be omitted.

According to this exemplary embodiment, with the structure mentioned above, signal processing which has strong robustness to the interference signal, low residual echo and low distortion of the output signal can be realized.

Sixth Exemplary Embodiment

Figure 6:
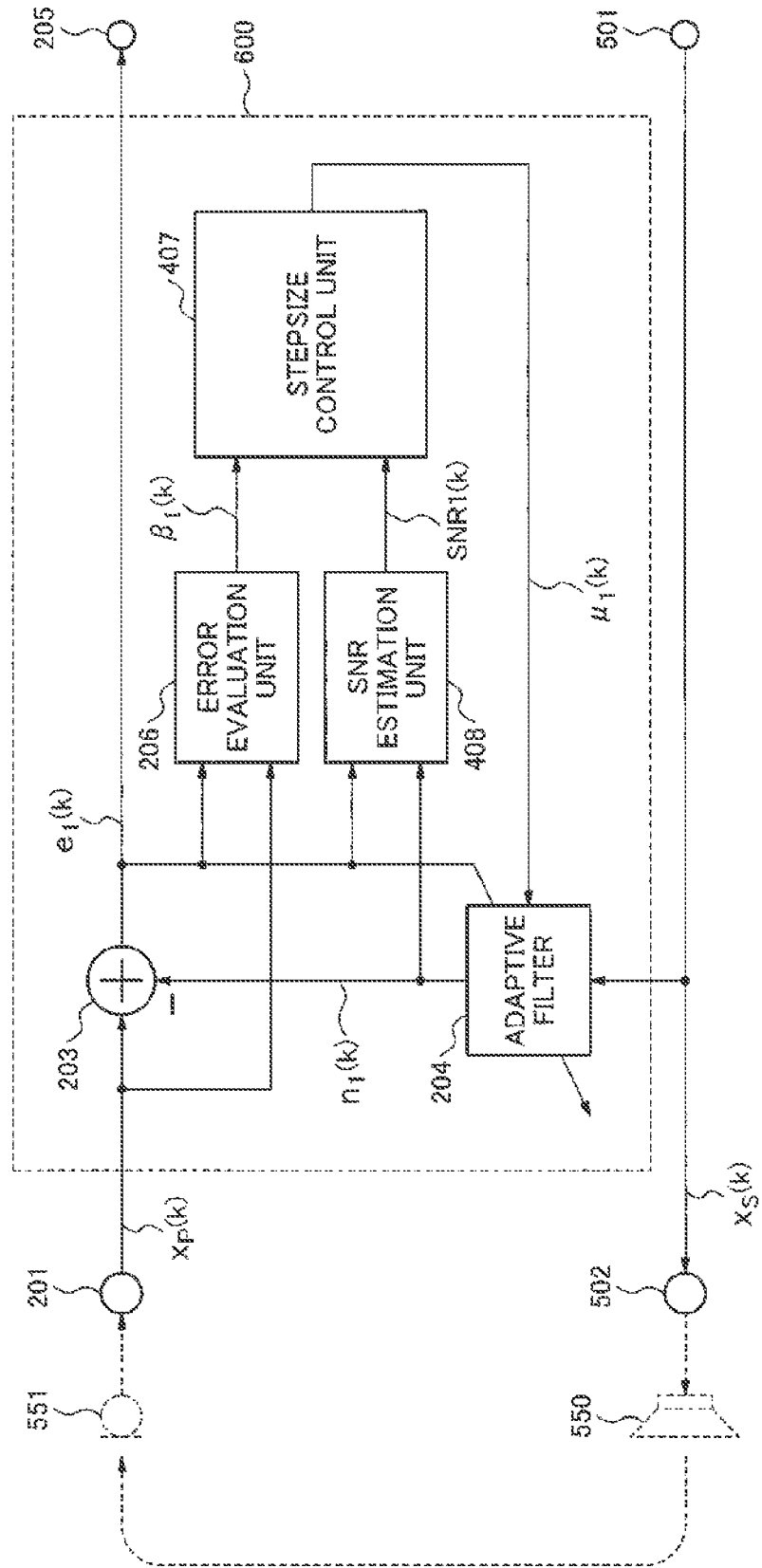
FIG. 6 A block diagram showing a structure of a signal processing device according to a sixth exemplary embodiment of the present invention.

A noise cancellation device 600 as a sixth exemplary embodiment of the present invention will be described using FIG. 6. In this exemplary embodiment, it differs from the fifth exemplary embodiment in that the SNR estimation unit 408 is added. Since the other components are similar to those of the fifth exemplary embodiment, the same reference sign is used for the similar component and its description will be omitted.

According to this exemplary embodiment, signal processing which has strong robustness to the interference signal, low residual echo, and low distortion of the output signal can be realized Seventh Exemplary Embodiment In the description so far, it is assumed that the reference signal is the noise itself by capturing the reference signal at a location close to the noise source. However, in reality, there is a case where this condition cannot be satisfied. In such a case, the reference signal includes the noise and the voice signal mixed therewith. Such a mixed component of the voice signal in the reference signal is called a crosstalk.

A structure of a noise cancellation device applied when the crosstalk exists is disclosed in WO2005/024787.

In this exemplary embodiment, a second adaptive filter for cancelling the crosstalk, similarly to cancelling the noise, is introduced.

A noise cancellation device 700 generates a pseudo voice signal corresponding to a voice signal component which is mixed at the reference input terminal using the second adaptive filter which approximates impulse response of an acoustic path (a crosstalk path) from the voice signal source to the reference input terminal. And the noise cancellation device 700 cancels the voice signal component (crosstalk) by subtracting this pseudo voice signal from the signal inputted to the reference input terminal (reference signal).

Figure 7:
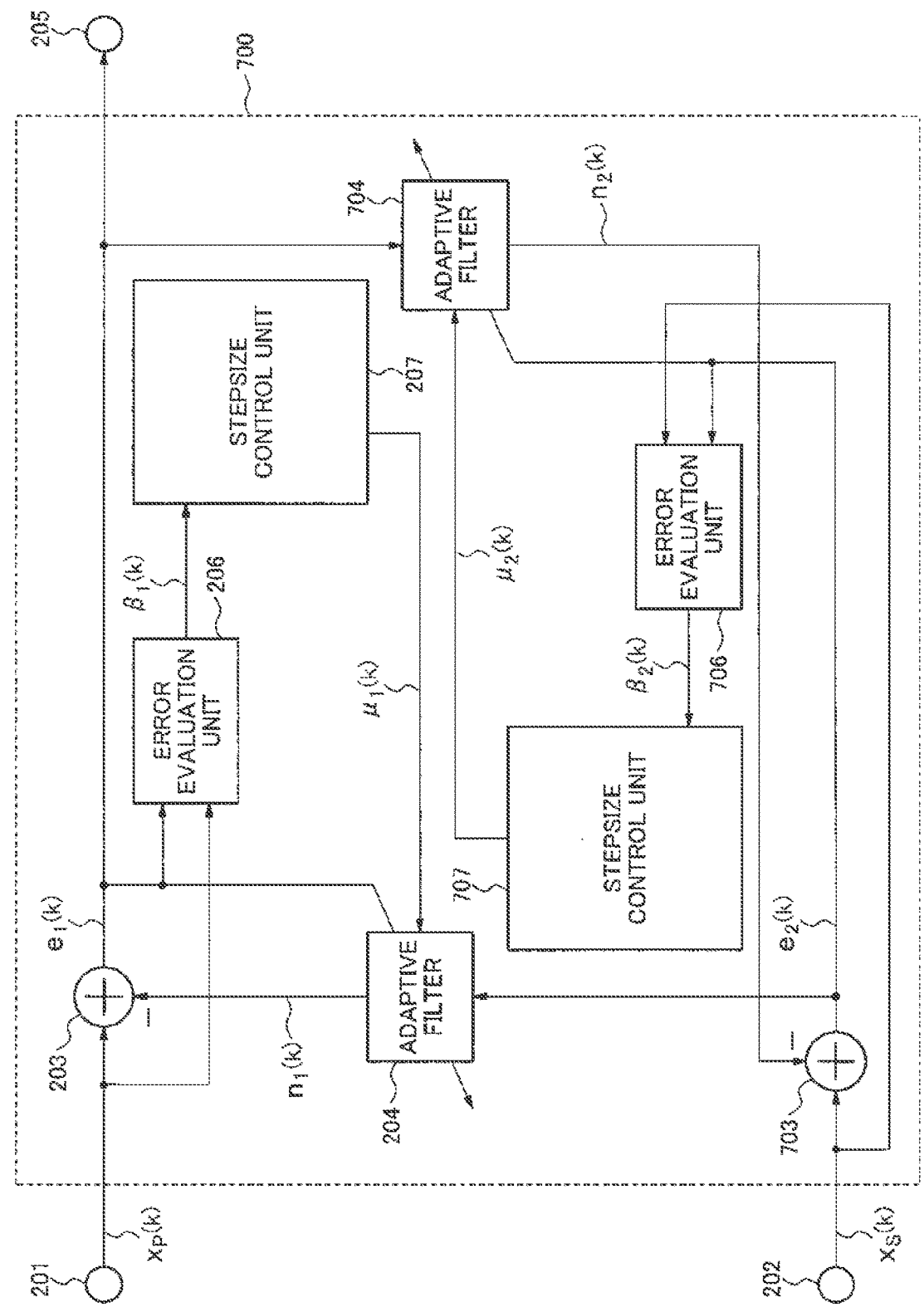
FIG. 7 A block diagram showing a structure of a signal processing device according to a seventh exemplary embodiment of the present invention.

The noise cancellation device 700 as a seventh exemplary embodiment of the present invention will be described using FIG. 7. Compared with the second exemplary embodiment, the noise cancellation device 700 according to this exemplary embodiment includes a subtractor 703, an adaptive filter 704, an error evaluation unit 706 and a stepsize control unit 707 in addition to the subtractor 203, the adaptive filter 204, the error evaluation unit 206 and the stepsize control unit 207. Since other components and operation are similar to those of the second exemplary embodiment, the same reference sign is used for the similar component and the detailed description will be omitted.

The noise cancellation device 700 generates a pseudo crosstalk $n_2(k)$ by transforming a signal, which has a correlation with the crosstalk to be cancelled (output at the output terminal 205=estimated desired-signal), with the adaptive filter. And the noise cancellation device 700 cancels the crosstalk by subtracting this from the reference signal in which the voice and the noise are mixed. In coefficient update of the adaptive filter based on the crosstalk cancellation result, the noise cancellation device 700 compares the signal before and after subtraction, and when the signal after subtraction is not smaller than the signal before subtraction, judges that it is in an abnormal situation and makes a coefficient update amount smaller.

The reference signal in which the voice and the noise are mixed is supplied to the input terminal 202, as a series of sample values. The reference signal is transmitted to the subtractor 703 and the error evaluation unit 706.

The estimated desired-signal $e_1(k)$ is supplied to the adaptive filter 704 from the output terminal 205. The adaptive filter 704 performs convolution operation of the estimated desired-signal $e_1(k)$ and the filter coefficients and transmits the result to the subtractor 703 as the pseudo crosstalk $n_2(k)$.

To the subtractor 703, the reference signal $x_s(k)$ is supplied from the input terminal 202 and the pseudo crosstalk $n_2(k)$ is supplied from the adaptive filter 704. The subtractor 703 subtracts the pseudo crosstalk $n_2(k)$ from the reference signal $x_s(k)$, transmits the result to the adaptive filter 204 and the error evaluation unit 706 and, at the same time, feeds it back to the adaptive filter 704.

Since the operation of the error evaluation unit 706 and the stepsize control unit 707 is similar to the operation of the error evaluation unit 206 and the stepsize control unit 207 described in the second exemplary embodiment, the detailed description is omitted.

According to this exemplary embodiment, with the structure mentioned above, signal processing which has strong robustness to the interference signal, low residual noise, low distortion of the output signal can be realized in the situation where the crosstalk exists.

Eighth Exemplary Embodiment

A noise cancellation device 800 as an eighth exemplary embodiment of the present invention will be described using FIG. 8. Compared with the seventh exemplary embodiment, the noise cancellation device 800 according to this exemplary embodiment further includes SNR estimation units 408 and 808.

The noise cancellation device 800 generates the pseudo crosstalk by transforming the signal, which has a correlation with the crosstalk to be cancelled (output at the output terminal 205=estimated value of the voice), with the adaptive filter. And the noise cancellation device 800 cancels the crosstalk by subtracting this from the noise on which the voice is superimposed. In coefficient update of the adaptive filter based on the crosstalk cancellation result, the noise cancellation device 800 compares the signal before and after subtraction, and when the signal after subtraction is not smaller than the signal of before subtraction, judges that it is in an abnormal situation and makes a coefficient update amount smaller. Further, the noise cancellation device 800 controls the coefficient update amount based on a second SNR estimated value supplied from the SNR estimation unit 808, that is, a ratio of the noise component and the voice signal component at the input terminal 202.

Note that, an ideal output of the subtractor 703 is the noise. Therefore a component which changes by the coefficient update of the adaptive filter 704 is a residual crosstalk, and the noise component which is not affected is the interference component in the coefficient update of the adaptive filter 704. From these relations, a second SNR estimated value $SNR2(k)$ supplied from the SNR estimation unit 808 is not a ratio of the voice signal component to the noise component at the input terminal 202, but is a ratio of the noise component to the crosstalk component (noise to crosstalk ratio).

Figure 8:
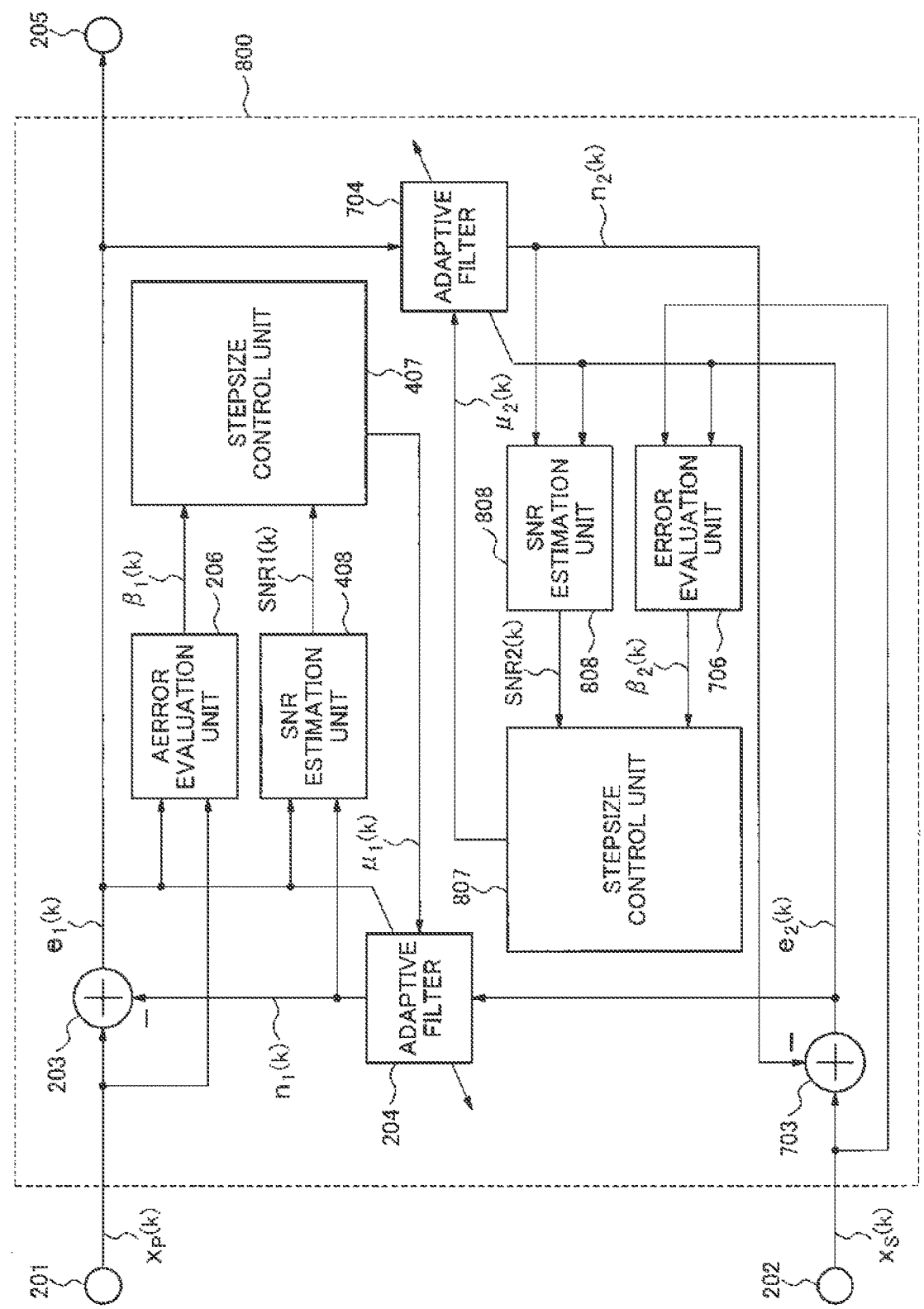
FIG. 8 A block diagram showing a structure of a signal processing device according to an eighth exemplary embodiment of the present invention.

In FIG. 8, the SNR estimation unit 808 obtains a ratio of the estimated noise signal $e_2(k)$ which is the output of the subtractor 703 to the output of the adaptive filter 704 $n_2(k)$ as the second SNR estimated value $SNR2(k)$.

The estimated noise signal $e_2(k)$ can be used as an estimated value of the noise $n_0(k)$ and the output of the adaptive filter 704 $n_2(k)$ can be used as an estimated value of the crosstalk component included in the second mixed signal $x_s(k)$.

Accordingly, a ratio of them can be used as the SNR estimated value $SNR2(k)$ (estimated value of noise to crosstalk ratio). The SNR estimation unit 808 supplies the obtained SNR estimated value $SNR2(k)$ to the stepsize control unit 807.

Since the SNR estimation unit 808 is exactly same as the structure of the SNR estimation unit 408 described in the fourth exemplary embodiment using FIG. 4, the detailed description is omitted.

Next, operation of the step size control unit 807 will be described along with the operation of the stepsize control unit 407 which has been already described in the fourth exemplary embodiment.

A signal $\beta_2(k)$ representing existence of the noise $n_0(k)$ is supplied from the error evaluation unit 706 to the stepsize control unit 807. Also, the SNR estimated value $SNR2(k)$ is supplied to the stepsize control unit 807 from the SNR estimation unit 808. The step size control unit 807 calculates a value of $\mu_2(k)$ based on the information by the following equation and transmits it to the adaptive filter 704.

$$\mu_2(k)=\mu_0 \cdot \alpha_2(k) \cdot m2(k) \qquad \text{(Equation 28)}$$

$$m2(k)=\Phi_2\{SNR2(k)\} \qquad \text{(Equation 29)}$$

Having high of the SNR estimated value $SNR2(k)$ means that power of the noise $n_0(k)$ is large. Therefore the function $\Phi_2\{\ \}$ is designed in such a way that a value of $\mu_2(k)$ becomes smaller when SNR is high, and a value of $\mu_2(k)$ becomes larger when SNR is low. That is, it is advisable to use a monotonic decreasing function which gives a small value when a value of the SNR estimated value SNR2($k$) is large and gives a large value when a value of SNR2($k$) is small, as the function $\Phi_2\{\ \}$. Also, its range is defined as $m2_{min} \leq m2(k) \leq m2_{max}$. Note that, $m2_{min}$ and $m2_{max}$ are constants which satisfy $m2_{min} < m2_{max}$.

A value of $\mu_2(k)$ is determined as $\mu_0 \cdot \alpha_2(k)$ based on the signal $\alpha_2(k)$ supplied from the error evaluation unit 706, as described in the fourth exemplary embodiment. The value of $\mu_2(k)$ determined in this way is further adjusted with a value $m2(k)=\Phi_2\{SNR2(k)\}$ based on the SNR estimated value SNR2($k$) supplied from the SNR estimation unit 808.

The simplest example of the function $\Phi_2\{\ \}$ is a downward sloping straight line, and it can be expressed by (Equation 30) to (Equation 32).

$$m2(k)=m2_{max}\ (m2_{max}<\Phi_2\{SNR2(k)\}) \qquad \text{(Equation 30)}$$

$$m2(k)=\Phi_2\{SNR2(k)\}(m2_{min}\leq\Phi_2\{SNR2(k)\}\leq m2_{max}) \qquad \text{(Equation 31)}$$

$$m2(k)=m2_{min}\ (m2_{min}>\Phi_2\{SNR2(k)\}) \qquad \text{(Equation 32)}$$

When values of SNR2 corresponding to the range $m2_{min}$ and $m2_{max}$ are represented by $SNR2_{min}$ and an upper limit value $SNR2_{max}$ respectively, the monotonic decreasing function $\Phi_2\{SNR2(k)\}$ can be expressed, for example, by the following (Equation 33) to (Equation 35).

$$\Phi_2\{SNR2(k)\}=-C\cdot SNR2(k)+D \qquad \text{(Equation 33)}$$

$$C=(m2_{max}-m2_{min})/(SNR2_{max}-SNR2_{min}) \qquad \text{(Equation 34)}$$

$$D=\{m2_{max}+m2_{min}+C\cdot(SNR2_{max}+SNR2_{min})\}/2 \qquad \text{(Equation 35)}$$

In order to obtain small m2($k$) when SNR2($k$) is large, and in order to obtain large m2($k$) when SNR2($k$) is small, the monotonic decreasing function is used. Other than the linear function shown in (Equation 33) to (Equation 35), a non-linear function such as a polynomial function or a trigonometric function or a more complicated function expressed by their combination, and so on may be used. Through the procedure mentioned above, the stepsize control unit 807 outputs $\mu_2(k)$ obtained by (Equation 28) as the stepsize.

The adaptive filter 704 updates coefficients using $\mu_2(k)$ supplied from the stepsize control unit 807 as the coefficient-update stepsize. The adaptive filter 704 can make the coefficient update amount smaller when the interference signal to the coefficient update exists, by using the coefficient-update-stepsize adjusted with $\alpha_2(k)$ and SNR2($k$) as shown by (Equation 28).

According to this exemplary embodiment, with the structure mentioned above, signal processing which has strong robustness to the interference signal, low residual noise, and low distortion of the output signal can be realized, in the situation when the crosstalk exists. Noise cancellation which has high follow-up performance to the environmental variation and low output distortion can be achieved for the input signal with wide range of a desired-signal to noise ratio in the primary signal and the reference signal.

Ninth Exemplary Embodiment

Figure 9:
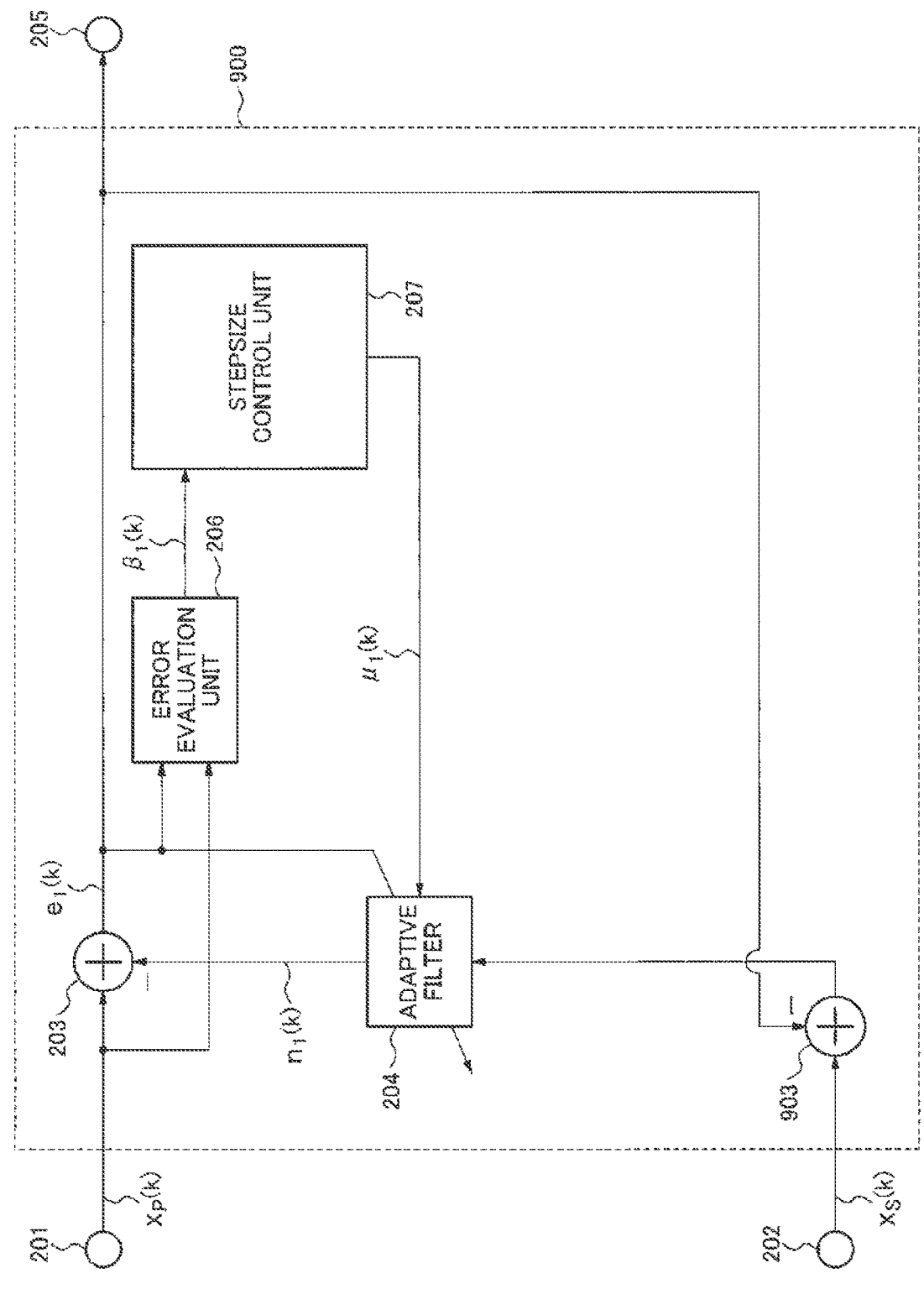
FIG. 9 A block diagram showing a structure of a signal processing device according to a ninth exemplary embodiment of the present invention.

A noise cancellation device 900 as a ninth exemplary embodiment of the present invention will be shown in FIG. 9. In this exemplary embodiment, in addition to the structure of the noise cancellation device 200 indicated in the second exemplary embodiment, a subtractor 903 is included. The subtractor 903 estimates a noise component of the reference signal and obtains the pseudo noise signal $n_1(k)$ by inputting the reference signal $x_s(k)$, subtracting the estimated desired-signal $e_1(k)$, and further performing filter processing with the adaptive filter 204.

According to this exemplary embodiment, signal processing which has low residual noise and low distortion of the output signal can be realized with higher accuracy.

Other Exemplary Embodiment

As above, although a plurality of exemplary embodiments of the present invention has been explained in detail, a system or a device which is a combination of separate features included in the respective exemplary embodiments arbitrarily is also included in the category of the present invention.

Also, the present invention may be applied to a system including a plurality of devices or it may be applied to a device of stand-alone. Further, the present invention is also applicable to a case when an information processing program which realizes the functions of the exemplary embodiments mentioned above is supplied directly or from remote to a system or a device. Such a program is executed by a processor such as a DSP (Digital Signal Processor) of which a signal processing device or a noise cancellation device is composed. Moreover, a program installed in a computer in order to realize the functions of the present invention by the computer, a medium which stored the program and a WWW (World Wide Web) server from which the program is downloaded are also included in the category of the present invention.

FIG. 10 is a block diagram of a computer 1000 which executes a signal processing program, in case the first exemplary embodiment is structured by the signal processing program. The computer 1000 includes an input unit 1001, a CPU 1002, an output unit 1003 and a memory 1004.

The CPU 1002 controls operation of the computer 1000 by reading the signal processing program stored in the memory 1004. That is, in Step S1011, the CPU 1002 executing the signal processing program inputs a primary signal in which a desired-signal and a noise are mixed from the input unit 1001 and inputs a reference signal in which the desired-signal and the noise are mixed in a different proportion from the primary signal. Next, in Step S1013, the CPU 1002 obtains a pseudo noise signal by performing filter processing to the reference signal with an adaptive filter using coefficients updated based on an estimated desired-signal.

Further, in Step S1015, the CPU 1002 subtracts the pseudo noise signal from the primary signal and outputs an error. In Step S1019, the CPU 1002 compares a value of the primary signal and a value of the error, and in case the value of the error is larger than the value of the primary signal, proceeds to Step S1021, and makes an update amount of the coefficients smaller as compared with a case when a value of the error is smaller than a value of the primary signal. As a result, the same effect as the first exemplary embodiment can be obtained.

Other Expressions of the Exemplary Embodiments

Although a part or all of the exemplary embodiments mentioned above can also be described as the following supplementary notes, they are not limited to the followings.

(Supplementary Note 1)

A signal processing device including:
first input means for inputting a first signal;
second input means for inputting a second mixed signal in which the first signal and the second signal are mixed in a different proportion from the first mixed signal;

first subtraction means for outputting the first mixed signal;

a first adaptive filter for performing filter processing to the second mixed signal using a first coefficient updated based on the estimated first signal in order to obtain the pseudo second signal;

first compare means for comparing with a value of the first mixed signal; and first control means for outputting a first control signal to make an update amount of the coefficient smaller as compared with a case when it is smaller than a value of the estimated first signal, to the first adaptive filter, as a result of comparison by the first compare means.

(Supplementary Note 2)

The signal processing device according to supplementary note 1, wherein the first adaptive filter inputs the second mixed signal.

(Supplementary Note 3)

The signal processing device according to either of supplementary notes 1 or 2, wherein the first compare means obtains an estimated first signal average value by averaging values of the first mixed signal, and compares the first mixed signal average value and the estimated first signal average value, and the first control means outputs the first control signal to make the coefficient update amount of the first adaptive filter smaller as compared with a case when the estimated first signal average value is smaller than the first mixed signal average value, to the first adaptive filter, in case the estimated first signal average value is larger than the first mixed signal average value.

(Supplementary Note 4)

The signal processing device according to either one of supplementary notes 1 to 3 further including a first ratio output unit for outputting a ratio to the estimated first signal as a first ratio, wherein the first control means outputs the first control signal to make a coefficient update amount of the first adaptive filter smaller as compared with a case when the value of the first ratio is small, to the first adaptive filter, in case a value of the first ratio is large.

(Supplementary Note 5)

The signal processing device according to either one of supplementary notes 1 to 4, wherein the first signal is a near-end signal, and the second signal is a far-end signal having no correlation with the near-end signal.

(Supplementary Note 6)

The signal processing device according to supplementary note 1, wherein the first adaptive filter inputs an estimated second signal based on the second mixed signal, and further including:

second subtraction means for outputting a pseudo first signal which is estimated to be mixed in the second mixed signal;

a second adaptive filter for performing filter processing using a second coefficient updated based on the pseudo first signal;

second compare means for comparing with a value of the second mixed signal; and second control means for outputting a second control signal to make an update amount of the second coefficient smaller as compared with a case when it is smaller than a value of the estimated second signal, to the second adaptive filter, as a result of comparison by the second compare means.

(Supplementary Note 7)

The signal processing device according to supplementary note 6, wherein the first compare means obtains an estimated first signal average value by averaging values of the first mixed signal, and compares the first mixed signal average value and the estimated first signal average value, the first control means outputs the first control signal to make a coefficient update amount of the first adaptive filter smaller as compared with a case when the estimated first signal average value is smaller than the first mixed signal average value, to the first adaptive filter, in case the estimated first signal average value is larger than the first mixed signal average value, the second compare means obtains an estimated second signal average value by averaging values of the second mixed signal, and compares the second mixed signal average value and the estimated second signal average value, and the second control means outputs the second control signal to make a coefficient update amount of the second adaptive filter smaller as compared with a case when the estimated second signal average value is smaller than the second mixed signal average value, to the second adaptive filter, in case the estimated second signal average value is larger than the second mixed signal average value.

(Supplementary Note 8)

The signal processing device according to either of supplementary notes 6 or 7 further including a second ratio output unit for outputting a ratio to the estimated second signal as a second ratio, wherein the second control means outputs the second control signal to make a coefficient update amount of the second adaptive filter smaller as compared with a case when a value of the second ratio is small, to the second adaptive filter, when a value of the second ratio is large.

(Supplementary Note 9)

The signal processing device according to either one of supplementary notes 1 to 8, wherein the first signal is a desired voice signal, the second signal is a noise signal, the first mixed signal is a signal in which the desired voice signal is mixed more than the noise signal, and the second mixed signal is a signal in which the noise signal is mixed more than the desired voice signal.

(Supplementary Note 10)

A signal processing method including:

generating an estimated first signal by subtracting a pseudo second signal which is estimated to be mixed in a first mixed signal in which a first signal and a second signal are mixed from the first mixed signal; and when obtaining the pseudo second signal which is estimated to be mixed in the first mixed signal by a first adaptive filter using a second mixed signal in which the first signal and the second signal are mixed in a different proportion from the first mixed signal, making a coefficient update amount of the first adaptive filter smaller as compare with a case when the estimated first signal is smaller than the first mixed signal, in case the estimated first signal is larger than the first mixed signal.

(Supplementary Note 11)

The signal processing method according to supplementary note 10, wherein the first adaptive filter generates the pseudo second signal by inputting the second mixed signal.

(Supplementary Note 12)

The signal processing method according to either of supplementary notes 10 or 11 further including:

obtaining an estimated first signal average value by averaging values of the first mixed signal;

comparing the first mixed signal average value and the estimated first signal average value; and making the coefficient update amount of the first adaptive filter smaller as compare with a case when the estimated first signal average value is smaller than the first mixed signal average value, in case the estimated first signal average value is larger than the first mixed signal average value.

(Supplementary Note 13)

The signal processing method according to either one of supplementary notes 10 to 12 further including:

outputting a ratio to the estimated first signal as a first ratio; and making the coefficient update amount of the first adaptive filter smaller as compared with a case when a value of the first ratio is small, in case a value of the first ratio is large.

(Supplementary Note 14)

The signal processing method according to either one of supplementary notes 10 to 13, wherein the first signal is a near-end signal, and the second signals is a far-end signal having no correlation with the near-end signal.

(Supplementary Note 15)

The signal processing method according to supplementary note 10, wherein the first adaptive filter inputs an estimated second signal based on the second mixed signal, and further including:

generating a pseudo first signal which is estimated to be mixed in the second mixed signal; and when obtaining the estimated first signal, making an update amount of the second coefficient smaller as compared with a case when it is smaller than a value of the estimated second signal.

(Supplementary Note 16)

The signal processing method according to supplementary note 15 further including:

obtaining an estimated first signal average value by averaging values of the first mixed signal;

comparing the first mixed signal average value and the estimated first signal average value;

making the coefficient update amount of the first adaptive filter smaller as compared with a case when the estimated first signal average value is smaller than the first mixed signal average value, in case the estimated first signal average value is larger than the first mixed signal average value;

obtaining an estimated second signal average value by averaging values of the second mixed signal;

comparing the second mixed signal average value and the estimated second signal average value; and making the coefficient update amount of the second adaptive filter smaller as compared with a case when the estimated second signal average value is smaller than the second mixed signal average value, in case the estimated second signal average value is larger than the second mixed signal average value.

(Supplementary Note 17)

The signal processing method according to either of supplementary notes 15 or 16 further including:

outputting a ratio to the estimated second signal as a second ratio; and making the coefficient update amount of the second adaptive filter smaller as compared with a time when the value of the second ratio is small, when a value of the second ratio is large.

(Supplementary Note 18)

The signal processing method according to either one of supplementary notes 10 to 17, wherein the first signal is a desired voice signal, the second signal is a noise signal, the first mixed signal is a signal in which the desired voice signal is mixed more than the noise signal, and the second mixed signal is a signal in which the noise signal is mixed more than the desired voice signal.

(Supplementary Note 19)

A signal processing program causing a computer to execute:

a step which generates an estimated first signal by subtracting a pseudo second signal which is estimated to be mixed in a first mixed signal in which a first signal and a second signal are mixed from the first mixed signal; and a step which, when obtaining the pseudo second signal which is estimated to be mixed in the first mixed signal by a first adaptive filter using a second mixed signal in which the first signal and the second signal are mixed in a different proportion from the first mixed signal, makes a coefficient update amount of the first adaptive filter smaller as compared with a case when the estimated first signal is smaller than the first mixed signal, in case the estimated first signal is larger than the first mixed signal.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese Patent Application No. 2010-228655, filed on Oct. 8, 2010, the disclosure of which is incorporated herein in its entirety by reference.

REFERENCE SIGNS LIST

101 First input unit
102 Second input unit
201, 202, 501 Input terminal
103 Subtraction unit
203, 703 Subtractor
104, 204, 704 Adaptive filter
205 Output terminal
106 Compare unit
206, 706 Error evaluation unit
107 Coefficient update control unit
207, 707 Stepsize control unit
408, 808 SNR estimation unit
361, 362 Averaging unit
363 Evaluation result calculation unit
550 Speaker
551 Microphone

What is claimed is:
1. A noise cancelling device comprising:
a first sensor which inputs a first mixed signal in which a desired signal and a noise signal are mixed;
a second sensor which inputs a second mixed signal in which said desired signal and said noise signal are mixed in a different proportion from said first mixed signal;
a first subtractor which generates an estimated desired signal by subtracting a replica of said noise signal from said first mixed signal;

a first adaptive filter which generates said replica of said noise signal by filtering said second mixed signal using a first set of coefficients updated by a first control signal;

a first comparator which compares a power of said estimated desired signal and a power of said first mixed signal; and a first controller which generates said first control signal to make an update amount of said first set of coefficients smaller as compared with an opposite case when a power of said estimated desired signal is larger than a power of said first mixed signal as a result of comparison by said first comparator.

2. The noise cancelling device according to claim 1, wherein said first adaptive filter inputs said second mixed signal.

3. The noise cancelling device according to claim 1, wherein said first comparator obtains a first mixed signal average power by averaging powers of said first mixed signal, obtains an estimated desired signal average power by averaging powers of said estimated desired signal, and compares said first mixed signal average power and said estimated desired signal average power, and said first controller generates said first control signal to make said update amount of said first set of coefficients smaller as compared with an opposite case when said estimated desired signal average power is larger than said first mixed signal average power.

4. The noise cancelling device according to claim 1, further comprising a first ratio generator which calculates a ratio of said power of said estimated desired signal to said power of said replica of said noise signal as a first ratio, wherein said first controller generates said first control signal to make said update amount of said first set of coefficients smaller as compared with an opposite case when a value of said first ratio is large.

5. The noise cancelling device according to claim 1, wherein said first adaptive filter inputs an estimated noise signal based on said second mixed signal, and further comprising:

a second subtractor which generates said estimated noise signal by subtracting a replica of said desired signal from said second mixed signal;

a second adaptive filter which generates said replica of said desired signal by filtering said estimated desired signal using a second set of coefficients updated by a second control signal;

a second comparator which compares a power of said estimated noise signal and a power of said second mixed signal; and a second controller which generates said second control signal to make an update amount of said second set of coefficients smaller as compared with an opposite case when a power of said estimated noise signal is larger than a power of said second mixed signal as a result of comparison by said second comparator.

6. The noise cancelling device according to claim 5, wherein said first comparator obtains a first mixed signal average power by averaging powers of said first mixed signal, obtains an estimated desired signal average power by averaging powers of said estimated desired signal, and compares said first mixed signal average power and said estimated desired signal average power, said first controller generates said first control signal to make said update amount of said first set of coefficients smaller as compared with an opposite case when said estimated desired signal average power is larger than said first mixed signal average power, said second comparator obtains a second mixed signal average power by averaging powers of said second mixed signal, obtains an estimated noise signal average power by averaging powers of said estimated noise signal, and compares said second mixed signal average power and said estimated noise signal average power, and said second controller generates said second control signal to make said update amount of said second set of coefficients smaller as compared with an opposite case when said estimated noise signal average power is larger than said second mixed signal average power.

7. The noise cancelling device according to claim 5, further comprising a second ratio generator which calculates a ratio of said power of said estimated noise signal to said power of said replica of said desired signal as a second ratio, wherein said second controller generates said second control signal to make said update amount of said second set of coefficients smaller as compared with an opposite case when a value of said second ratio is large.

8. A noise cancelling method comprising:

generating a replica of said noise signal which is mixed with a desired signal in a first mixed signal by filtering a second mixed signal in which said desired signal and said noise signal are mixed in a different proportion from said first mixed signal, using a set of coefficients-of a first adaptive filter updated by a first control signal;

generating an estimated desired signal by subtracting said replica of said noise signal from said first mixed signal; and generating said first control signal to make an update amount of said set of coefficients smaller as compared with an opposite case when a power of said estimated desired signal is larger than a power of said first mixed signal.

9. A non-transitory computer readable storage medium recording thereon a noise cancelling program causing a computer to execute a method comprising:

generating a replica of said noise signal which is mixed with a desired signal in a first mixed signal by filtering a second mixed signal in which said desired signal and said noise signal are mixed in a different proportion from said first mixed signal, using a set of coefficients-of a first adaptive filter updated by a first control signal;

generating an estimated desired signal by subtracting said replica of said noise signal from said first mixed signal; and generating said first control signal to make an update amount of said set of coefficients smaller as compared with an opposite case when a power of said estimated desired signal is larger than a power of said first mixed signal.

10. A noise cancelling device comprising:

first sensor means for obtaining a first mixed signal in which a desired signal and a noise signal are mixed;

second sensor means for obtaining a second mixed signal in which said desired signal and said noise signal are mixed in a different proportion from said first mixed signal;

first subtractor means for generating an estimated desired signal by subtracting a replica of a noise signal from said first mixed signal;
first adaptive filter means for generating said replica of said noise signal by filtering said second mixed signal using a first set of coefficients-updated by a first control signal;
first comparator means for comparing a power of said estimated desired signal and a power of said first mixed signal; and
first controller means for generating said first control signal to make an update amount of said first set of coefficients smaller as compared with an opposite case when a power of said estimated desired signal is larger than a power of said first mixed signal as a result of comparison by said first comparator means.

11. An echo cancelling device comprising:
a first sensor which inputs a first mixed signal in which a near-end signal and an echo signal are mixed;
a first input terminal which inputs a reference signal which is correlated with said echo signal;
a first subtractor which generates an estimated near-end signal by subtracting a replica of said echo signal from said first mixed signal;
a first adaptive filter which generates said replica of said echo signal by filtering said reference signal using a first set of coefficients updated by a first control signal;
a first comparator which compares a power of said estimated near-end signal and a power of said first mixed signal; and
a first controller which generates said first control signal to make an update amount of said first set of coefficients smaller as compared with an opposite case when a power of said estimated near-end signal is larger than a power of said first mixed signal as a result of comparison by said first comparator.

* * * * *